United States Patent
Lee et al.

(10) Patent No.: US 8,729,647 B2
(45) Date of Patent: May 20, 2014

(54) THERMALLY STABLE MAGNETIC TUNNEL JUNCTION CELL AND MEMORY DEVICE INCLUDING THE SAME

(71) Applicant: Samsung Electronics Co., Ltd., Suwon-Si (KR)

(72) Inventors: Sung-chul Lee, Osan-si (KR); Kwang-seok Kim, Seongnam-si (KR); Kee-won Kim, Suwon-si (KR); Young-man Jang, Hwaseong-si (KR); Ung-hwan Pi, Seoul (KR)

(73) Assignee: Samsung Electronics., Ltd., Gyeonggi-do (KR)

( * ) Notice: Subject to any disclaimer, the term of this patent is extended or adjusted under 35 U.S.C. 154(b) by 0 days.

(21) Appl. No.: 13/681,819

(22) Filed: Nov. 20, 2012

(65) Prior Publication Data
US 2014/0015073 A1   Jan. 16, 2014

(30) Foreign Application Priority Data
Jul. 10, 2012   (KR) .................. 10-2012-0075180

(51) Int. Cl.
*H01L 29/82* (2006.01)
*G11C 11/02* (2006.01)

(52) U.S. Cl.
USPC ........... 257/421; 257/422; 257/426; 257/427; 257/E29.323; 438/3; 365/157; 365/158; 360/324.2; 360/326

(58) Field of Classification Search
CPC ....... H04L 43/08; H04L 27/22; H04L 43/065; G11C 11/16
USPC ...................... 257/421–427, E29.323; 438/3; 365/157–158; 360/324–326
See application file for complete search history.

(56) References Cited

U.S. PATENT DOCUMENTS

| | | | |
|---|---|---|---|
| 6,408,122 B1 * | 6/2002 | Shimada et al. | 385/129 |
| 6,667,526 B2 * | 12/2003 | Komori | 257/421 |
| 6,798,690 B1 * | 9/2004 | Katti | 365/158 |
| 2003/0107057 A1 * | 6/2003 | Komori | 257/241 |
| 2009/0098412 A1 | 4/2009 | Ohsawa et al. | |

FOREIGN PATENT DOCUMENTS

| | | | |
|---|---|---|---|
| JP | 2004146614 A | 5/2004 | |
| JP | 2008217906 A | 9/2008 | |

* cited by examiner

*Primary Examiner* — Jami M Valentine
(74) *Attorney, Agent, or Firm* — Harness, Dickey & Pierce, P.L.C.

(57) ABSTRACT

A thermally stable Magnetic Tunnel Junction (MTJ) cell, and a memory device including the same, include a pinned layer having a pinned magnetization direction, a separation layer on the pinned layer, and a free layer on the separation layer and having a variable magnetization direction. The pinned layer and the free layer include a magnetic material having Perpendicular Magnetic Anisotropy (PMA). The free layer may include a central part and a marginal part on a periphery of the central part. The free layer is shaped in the form of a protrusion in which the central part is thicker than the marginal part.

20 Claims, 6 Drawing Sheets

THERMALLY STABLE MAGNETIC TUNNEL JUNCTION CELL AND MEMORY DEVICE INCLUDING THE SAME

CROSS-REFERENCE TO RELATED APPLICATIONS

This application claims the benefit of priority under 35 U.S.C. §119 from Korean Patent Application No. 10-2012-075180, filed on Jul. 10, 2012, in the Korean Intellectual Property Office, the disclosure of which is incorporated herein by reference in its entirety.

BACKGROUND

1. Field

The present disclosure relates to a magnetic tunnel junction (MTJ) cell and a memory device including the same, and more particularly, to a thermally stable perpendicular magnetic anisotropy (PMA) MTJ cell and a memory device including the same.

2. Description of the Related Art

For example, a magnetic memory device, such as a Magnetic Random Access Memory (MRAM), is a memory device configured for storing data using a resistance change in an MTJ cell, and because the magnetic memory device is nonvolatile, operates at a high speed, and has high durability, lots of research into a magnetic memory device has been conducted as one of the next generation of nonvolatile memory devices.

In general, a resistance of an MTJ cell varies according to a magnetization direction of a free layer. For example, when the magnetization direction of the free layer is the same as a magnetization direction of a pinned layer, the MTJ cell may have a low resistance value. When the magnetization direction of the free layer is opposite to the magnetization direction of the pinned layer, the MTJ cell may have a high resistance value. When this characteristic is used for a memory device, for example, the low resistance value of the MTJ cell may correspond to data '0', and the high resistance value of the MTJ cell may correspond to data '1'.

To maintain data stored in the MTJ cell without being damaged for a long time, the MTJ cell may have thermal stability. Commonly, the thermal stability of the MTJ cell is related to an energy barrier Eb of the free layer. For example, when the free layer is a magnetic anisotropy material layer and, if Eb/kT (k: Boltzmann constant, T: absolute temperature) is about 60, then it is known that the thermal stability of the MTJ cell is guaranteed for about 10 years. Although a little difference exists according to the thickness of the free layer, when a feature size of the MTJ cell is 40 nm or above, Eb/kT is about 60, which indicates that it is difficult to decrease the feature size of the MTJ cell to less than 40 nm. Accordingly, it is not easy to increase the recording density of an MRAM to a certain level or above. In addition, although the feature size of the MTJ cell may decrease when the thickness of the free layer increases, the increase in the thickness of the free layer may make it difficult to record data.

Accordingly, various attempts to decrease the feature size of the MTJ cell have been made. For example, there is a method of forming the MTJ cell using a perpendicular magnetic anisotropy (PMA) material. In general, because an energy barrier of the free layer increases as the magnetic anisotropy energy of the PMA material increases, the feature size of the MTJ cell may decrease by using a PMA material having high magnetic anisotropy energy. However, because most PMA materials having high magnetic anisotropy energy have a low magnetoresistance (MR) ratio, the PMA materials having high magnetic anisotropy energy may not be suitable for memory devices.

SUMMARY

The present disclosure relates to a magnetic tunnel junction (MTJ) cell and a memory device including the same, and more particularly, to a thermally stable perpendicular magnetic anisotropy (PMA) MTJ cell and a memory device including the same.

Provided is a magnetic memory device capable of increasing a recording density by reducing a feature size of a MTJ cell.

According to example embodiments, a MTJ cell includes a pinned layer having a pinned magnetization direction, a separation layer on the pinned layer, and a free layer on the separation layer and having a variable magnetization direction. At least one of the pinned layer and the free layer includes a magnetic material having PMA. The free layer includes a central part and a marginal part on a periphery of (or, alternatively, around) the central part, and the free layer is shaped in the form of a protrusion in which the central part is thicker than the marginal part.

The magnetic material may have interface PMA (IPMA).

The pinned layer may include a first pinned layer, a spacer, and a second pinned layer sequentially stacked, and the first pinned layer and the second pinned layer may have pinned magnetization directions opposite to each other.

The first and second pinned layers may be formed of the magnetic material, and the magnetic material may have IPMA.

The first pinned layer, the spacer, and the second pinned layer may form a synthetic anti-ferromagnetic (SAF) structure.

The central part may have a semi-cylindrical shape, and the marginal part may have a flat shape.

The marginal part may be inclined, and the central part may gradually rise towards a center of the central part from the inclined marginal part.

The free layer may be shaped in the form of a disc, the marginal part of the free layer may be shaped in the form of a flat disc, and the central part of the free layer protrudes from the flat disc and is shaped in the form of the disc.

The free layer may include a plurality of domains in which a domain wall is at an interface between adjacent domains, and an area of the domain wall may be widest in the central part.

According to other example embodiments, a memory device includes at least one memory cell, each at least one memory cell including a MTJ cell and a switching device connected to the MTJ cell. The MTJ cell may include a pinned layer having a pinned magnetization direction, a separation layer on the pinned layer, and a free layer on the separation layer and having a variable magnetization direction. At least one of the pinned layer and the free layer includes a magnetic material having PMA. The free layer includes a central part and a marginal part on a periphery of (or, alternatively, around) the central part, and is shaped in the form of a protrusion in which the central part is thicker than the marginal part.

The magnetic material may have interface PMA (IPMA).

The pinned layer may include a first pinned layer, a spacer, and a second pinned layer sequentially stacked, and the first pinned layer and the second pinned layer may have pinned magnetization directions opposite to each other.

The first and second pinned layers may be formed of the magnetic material, and the magnetic material may have IPMA.

The first pinned layer, the spacer, and the second pinned layer may form a synthetic anti-ferromagnetic (SAF) structure.

The central part may have a semi-cylindrical shape, and the marginal part may have a flat shape.

The marginal part may be inclined, and the central part may gradually rise towards a center of the MTJ cell from the inclined marginal part.

The free layer may be shaped in the form of a disc, the marginal part of the free layer may have a flat shape, and the central part may protrude from the marginal part and is shaped in the form of the disc.

The free layer may include a plurality of domains in which a domain wall is at an interface between adjacent domains, and an area of the domain wall may be widest in the central part.

The memory device may be a Spin Transfer Torque Magnetic Random Access Memory (STT-MRAM).

The memory device may further include a bit line and a word line crossing each other, wherein the bit line is electrically connected to the pinned layer of the MTJ cell, and the word line is electrically connected to the switching device.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

DETAILED DESCRIPTION

The present disc Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to a magnetic tunnel junction (MTJ) cell and a memory device including the same, and more particularly, to a thermally stable perpendicular magnetic anisotropy (PMA) MTJ cell and a memory device including the same.

Figure 1:
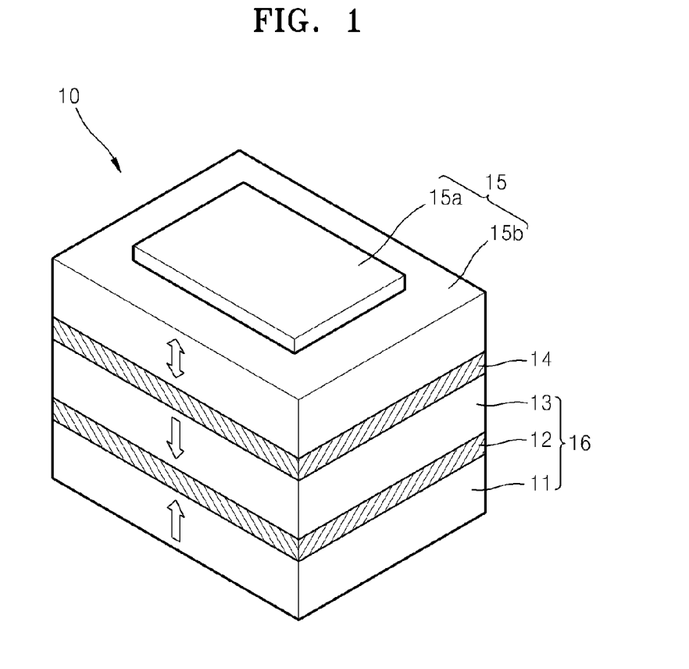
FIG. 1 is a perspective view showing a structure of a Magnetic Tunnel Junction (MTJ) cell according to example embodiments.

FIG. 1 is a perspective view showing a structure of an MTJ cell according to example embodiments.

Referring to FIG. 1, an MTJ cell 10 may include a pinned layer 16, and a separation layer 14 and a free layer 15 sequentially stacked on the pinned layer 16 in this order.

The pinned layer 16 is a magnetic layer having a pinned magnetization direction and may be formed by a ferromagnetic material. For example, the ferromagnetic material forming the pinned layer 16 may include at least one selected from the group consisting of Cobalt (Co), iron (Ferrum: Fe), and Nickel (Ni) and may further include other elements, for example, Boron (B), Chromium (Cr), Platinum (Pt), Palladium (Pd), and similar elements. The free layer 15 is a magnetic layer having a variable magnetization direction. Like the pinned layer 16, the free layer 15 may be formed by a ferromagnetic material including at least one selected from the group consisting of, for example, Co, Fe, and Ni and may further include other elements, for example, B, Cr, Pt, Pd, and similar elements. The free layer 15 may be formed by a different material from, or the same material as, the pinned layer 16. The separation layer 14 may be formed by insulation materials. For example, the separation layer 14 may include insulation materials, such as Magnesium (Mg) oxide and/or Aluminum (Al) oxide. When the separation layer 14 is formed by the insulation materials (specifically, magnesium oxide), a magnetoresistance (MR) ratio of the MTJ cell 10 may increase. However, the separation layer 14 is not necessarily limited to the insulation materials. In some cases, the separation layer 14 may be formed by conductive materials. In this case, the separation layer 14 may include at least one conductive material (e.g., metal) selected from the group consisting of, for example, Rubidium (Ru), Cuprum (Cu), Al, gold (Aurum: Au), silver (Argentum: Ag), and a mixture thereof.

The pinned layer 16 may be formed as a single-layer structure, or a multi-layer structure. For example, the pinned layer 16 may include a first pinned layer 11, a spacer 12 stacked on the first pinned layer 11, and a second pinned layer 13 stacked on the spacer 12. The first and second pinned layers 11 and 13 arranged adjacent to each other with the spacer 12 therebetween may have pinned magnetization directions that are opposite to each other. This may indicate that the first pinned layer 11, the spacer 12, and the second pinned layer 13 form a Synthetic Anti-Ferromagnetic (SAF) structure. Although the first and second pinned layers 11 and 13 may be formed by the same ferromagnetic material, the first and second pinned layers 11 and 13 are not limited thereto and may be formed by different ferromagnetic materials. The spacer 12 may include a conductive material, for example, at least one selected from the group consisting of Ru, Cu, Al, Au, Ag, and a mixture thereof. The first and second pinned layers 11 and 13 magnetized in opposite directions may cancel a stray magnetic field of the other one. Thus, the use of the first and second pinned layers 11 and 13 magnetized in opposite directions may restrain or prevent a stray magnetic field generated by the pinned layer 16 from affecting the free layer 15.

In the current example embodiments, the first pinned layer 11, the second pinned layer 13, and the free layer 15 may have Perpendicular Magnetic Anisotropy (PMA), and more particularly, Interface PMA (IPMA). For this, the first pinned layer 11, the second pinned layer 13, and the free layer 15 may be formed by a hard magnetic material. The hard magnetic material has relatively high magnetic anisotropy energy Ku of, e.g., $10^6$~$10^7$ erg/cc. The first and second pinned layers 11 and 13 and the free layer 15 formed by a hard magnetic material having this high magnetic anisotropy energy may have a magnetization easy axis that is perpendicular to the interface due to the high magnetic anisotropy energy. In detail, the first and second pinned layers 11 and 13 and the free layer 15 may have a multi-layer structure in which a first layer formed by at least one selected from the group consisting of Cobalt (Co) and a Cobalt alloy, and a second layer formed by at least one selected from the group consisting of Pt, Ni, and Pd are alternately stacked. The first and second pinned layers 11 and 13 and the free layer 15 may be an FePt or a CoPt layer having an L10 structure. The first and second pinned layers 11 and 13 and the free layer 15 may be an alloy layer of a rare earth element and a transition metal. The rare earth element may be at least one selected from the group consisting of Terbium (Tb) and Gadolinium (Gd), and the transition metal may be at least one selected from the group consisting of Ni, Fe, and Co. Various alloy sets of rare earth elements and transition metals may be used, wherein, for example, CoFeB or CoFe may be used as a material of the first and second pinned layers 11 and 13 and the free layer 15.

As shown in FIG. 1, the free layer 15 of the MTJ cell 10 may have a central part 15a having a relatively thick thickness and a marginal part 15b having a relatively thin thickness. That is, the central part 15a of the free layer 15 may be formed thicker than the marginal part 15b. Although the central part 15a is formed in a staircase shape as shown in FIG. 1, a structure of the free layer 15 is not limited thereto.

Figure 2A:
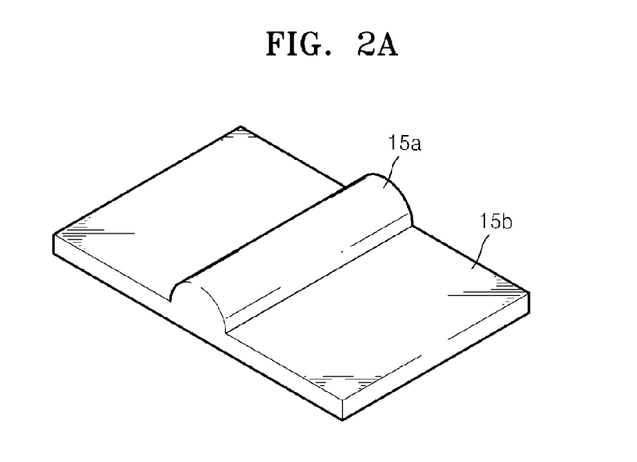
FIGS. 2A to 2C are perspective views showing various structures of a free layer of an MTJ cell according to example embodiments.
Figure 2B:
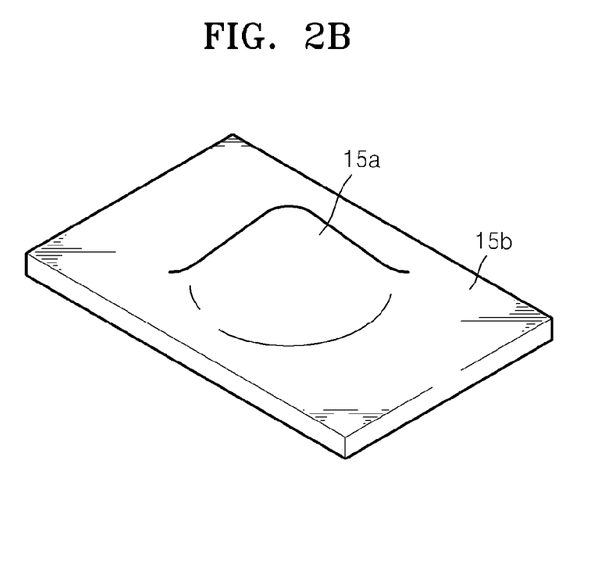
Figure 2C:
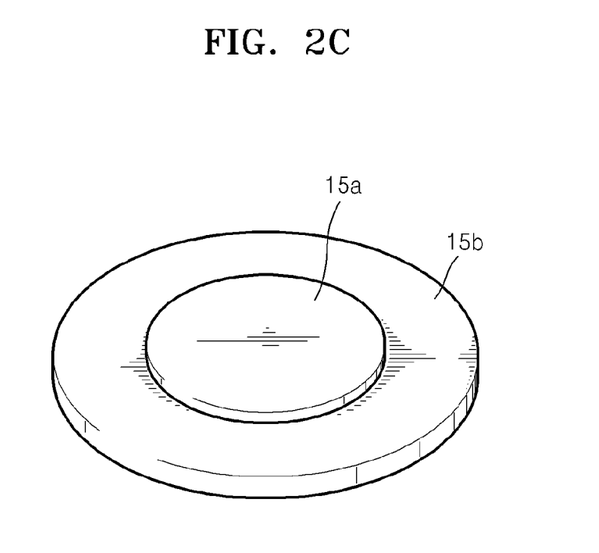

FIGS. 2A to 2C are perspective views showing various structures of the free layer according to example embodiments.

For example, the free layer 15 may have a central part 15a having a semi-cylindrical shape and a marginal part 15b having a substantially flat shape, as shown in FIG. 2A, or the free layer 15 may have a central part 15a gradually rising towards the center from a marginal part 15b inclined in all directions, as shown in FIG. 2B. Although the free layer 15 is rectangular in FIGS. 2A and 2B, the free layer 15 may have a disc shape, as shown in FIG. 2C. In this case, the free layer 15 may have a marginal part 15b having a flat disc shape and a central part 15a having a protruding disc shape. Although not shown, the free layer 15 may have a central part rising from a circular bottom, i.e., a cone shape. Besides the shapes described above, the free layer 15 may be formed in various shapes as long as a thickness of a central part is thicker than a marginal part.

In this structure, an energy barrier of the free layer 15 may increase due to the thick central part 15a because an area of a domain wall increases in the central part 15a. The energy barrier is theoretically caused by the domain wall. That is, as the area of the domain wall in the central part 15a increases, the energy barrier of the free layer 15 may also increase. This principle may be understood through FIG. 3A to 3D conceptually showing a process of changing a magnetization direction in the free layer 15.

Figure 3A:
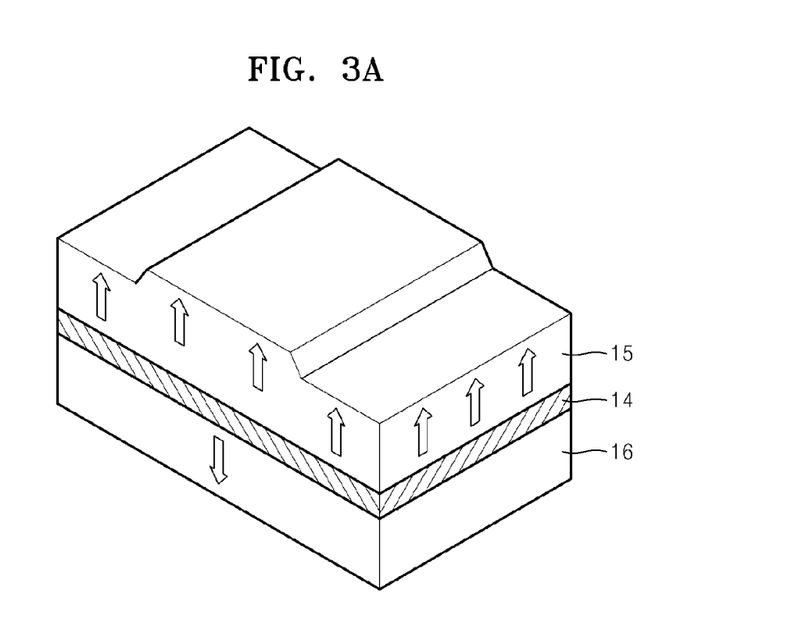
FIGS. 3A to 3D are conceptual diagrams showing a process of changing a magnetization direction in a free layer in an MTJ cell.

Referring to FIG. 3A, it is assumed that the free layer 15 is initially magnetized in an opposite direction to the pinned layer 16. For example, the pinned layer 16 may be magnetized downwards while the free layer 15 may be magnetized upwards. This state in which the free layer 15 is initially magnetized in an opposite direction to the pinned layer 16 is referred to as an anti-parallel state, and in this state, the MTJ cell 10 may have a high resistance.

Figure 3B:
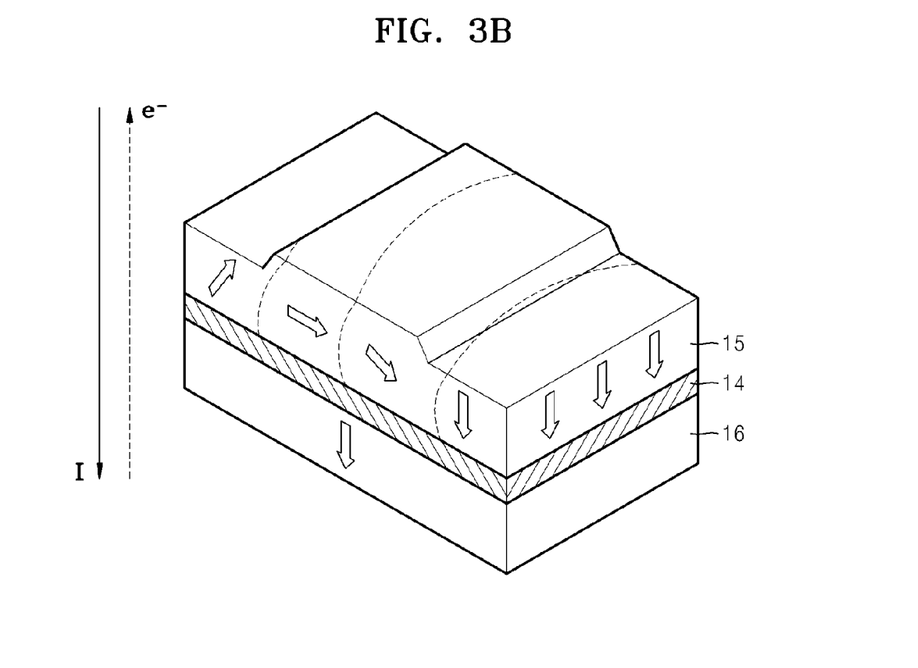

To change the magnetization direction of the free layer 15, a current I may be applied from the free layer 15 to the pinned layer 16, as shown in FIG. 3B. In this case, the current I flows from the free layer 15 to the pinned layer 16 via the separation layer 14, and accordingly, electrons e⁻ flow from the pinned layer 16 to the free layer 15. The electrons e⁻ flowing from the pinned layer 16 to the free layer 15 have the same spin direction as the pinned layer 16 and apply a spin torque to the free layer 15. Accordingly, the free layer 15 may be magnetized in the same direction as the pinned layer 16. This state in which the free layer 15 is magnetized in the same direction as the pinned layer 16 is referred to as a parallel state, and in this state, the MTJ cell 10 may have a low resistance.

Figure 3C:
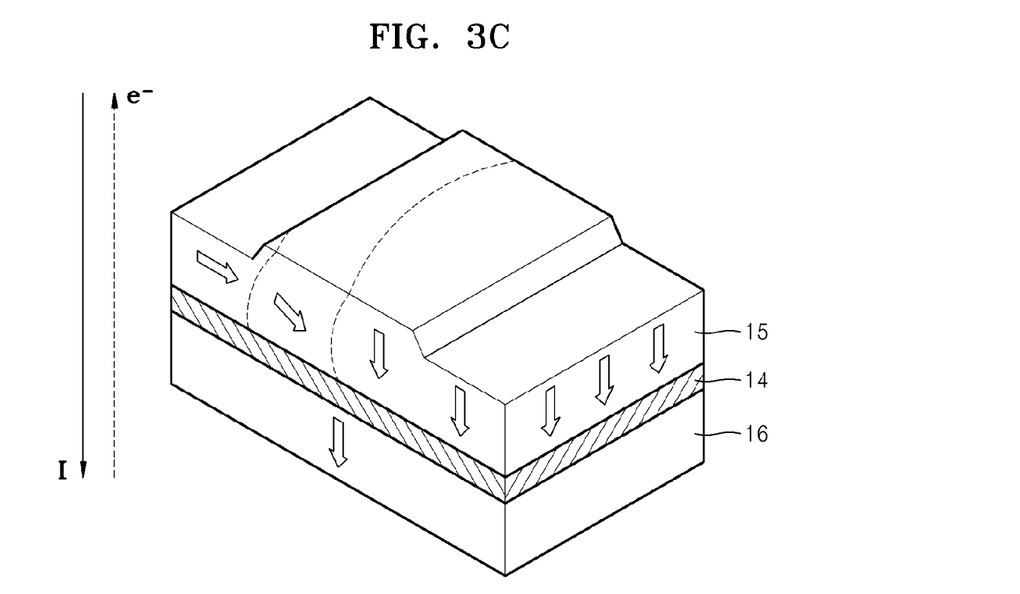
Figure 3D:
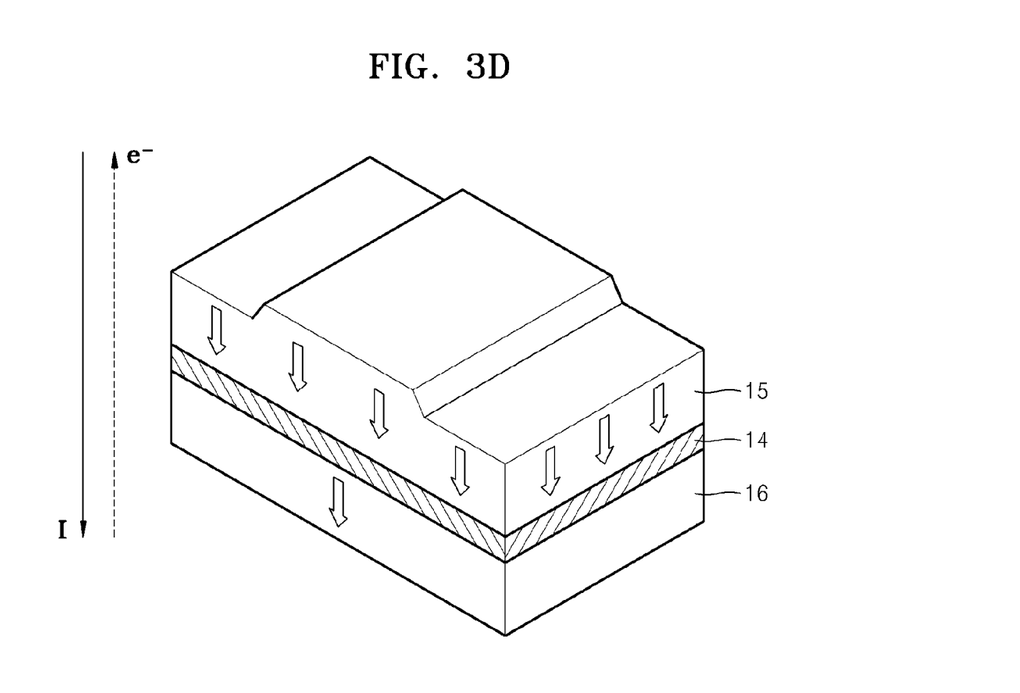

In addition, the free layer 15 includes a plurality of domains instead of a single domain, and the plurality of domains may be sequentially magnetized instead of magnetized at the same time. For example, as shown in FIG. 3B, the magnetization direction may be changed from any one end of the free layer 15. Thereafter, as shown in FIGS. 3C and 3D, the magnetization direction may be entirely changed from one end of the free layer 15 to the other end of the free layer 15 via the center part 15a of the free layer 15. The interface (dashed line in FIGS. 3B and 3C) between the domains having different magnetization directions is referred to as a domain wall, and an area of the domain wall is widest in the center part 15a having the thickest thickness. Because an energy barrier increases as the domain wall is widened, higher energy is needed to change a magnetization direction of the domain in the center part 15a of the free layer 15.

As a result, even though a magnetization direction starts temporarily changing in the thin marginal part 15b of the free layer 15 due to an external influence, it is difficult to eventually change the magnetization direction due to the large energy barrier of the center part 15a. Thus, if a volume of the free layer 15 is the same, an energy barrier of the free layer 15 may increase when the center part 15a of the free layer 15 protrudes, and accordingly, a feature size of the MTJ cell 10 may be reduced.

Figure 4:
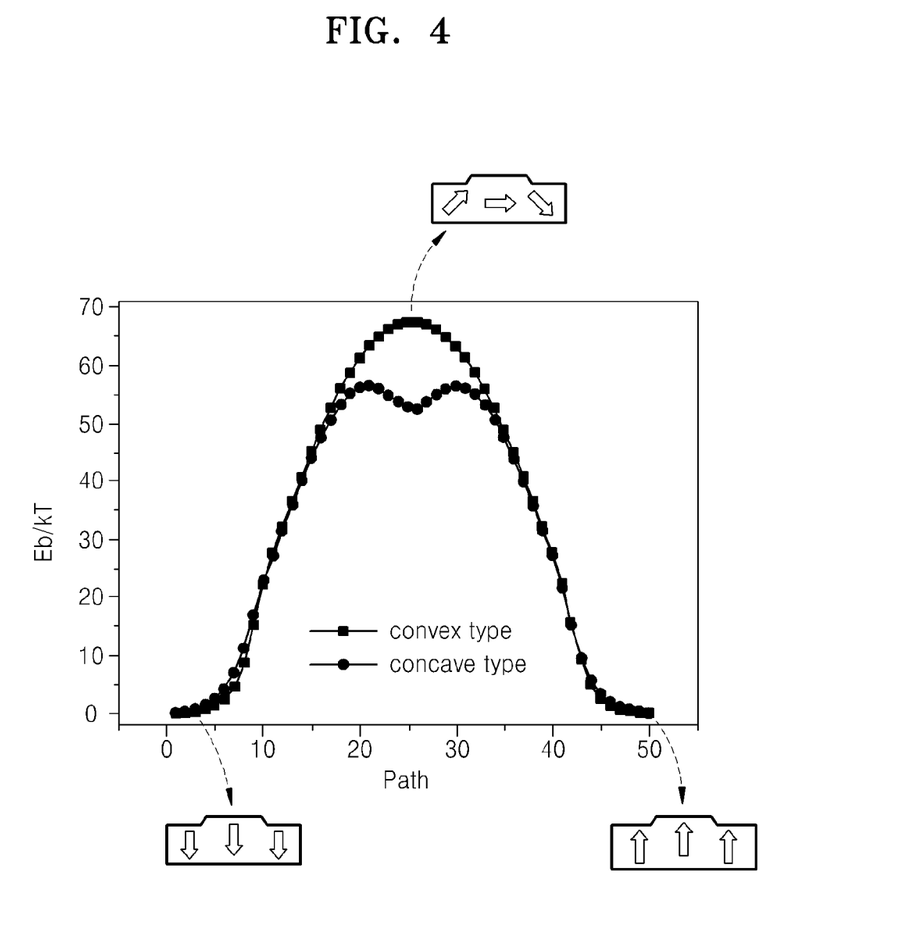
FIG. 4 is a graph showing a result of measuring an energy barrier Eb/kT along a switching path of a free layer of the MTJ cell of FIG. 1.

FIG. 4 is a graph showing a result of measuring an energy barrier to thermal energy Eb/kT along a switching path of a free layer of the MTJ cell of FIG. 1.

For example, FIG. 4 is a graph showing a result of measuring a ratio of an energy barrier to thermal energy Eb/kT along a switching path of the free layer 15 having a length of 20 nm, a width of 10 nm, and a mean thickness of 3.2 nm.

In the graph of FIG. 4, '—■—' denotes a case of measuring the free layer 15 having the thick central part 15a as in the current example embodiments, and '—●—' denotes a case of measuring a free layer having a thin central part with the same volume as a comparing example. In the two cases, it is assumed that magnetic anisotropy energy Ku is $10^7$ erg/cc, a saturated magnetization value Ms is 1000 emu/cc, and an exchange stiffness constant A* is $10^{-6}$ erg/cm. According to the graph of FIG. 4, the free layer 15 having the thick central part 15a as in the current example embodiments is in the highest energy state when a average magnetization direction is a horizontal direction, wherein Eb/kT is about 65. On the contrary, the energy barrier of the free layer having a thin central part is reduced when the average magnetization direction is the horizontal direction, wherein a maximum value of Eb/kT is not above 60.

As described above, because an energy barrier is proportional to magnetic anisotropy energy, the feature size of the MTJ cell 10 may be reduced by using a magnetic anisotropy material having high magnetic anisotropy energy. However, because increasing magnetic anisotropy energy with only a simple selection of a magnetic material is limited, reducing the feature size of the MTJ cell 10 is also limited. In addition, magnetic materials satisfying both high magnetic anisotropy energy and a high MR ratio (e.g., 100% or above) are limited. According to the current example embodiments, an energy barrier may increase regardless of magnetic anisotropy energy of a magnetic material by forming the central part 15a of the free layer 15 in a protrusion shape. Thus, the free layer 15 may be formed with both a high MR ratio and a high energy barrier regardless of types of a PMA material. In addition, because a high energy barrier may be obtained even without rarely increasing a total volume of the free layer 15 by increasing the thickness of the central part 15a, a problem where data record/delete in the free layer 15 is difficult when a volume increases may be prevented.

According to the current example embodiments, because the feature size of the MTJ cell 10 may be largely reduced, a recording density of a magnetic memory device formed using the MTJ cell 10 may largely increase.

Figure 5:
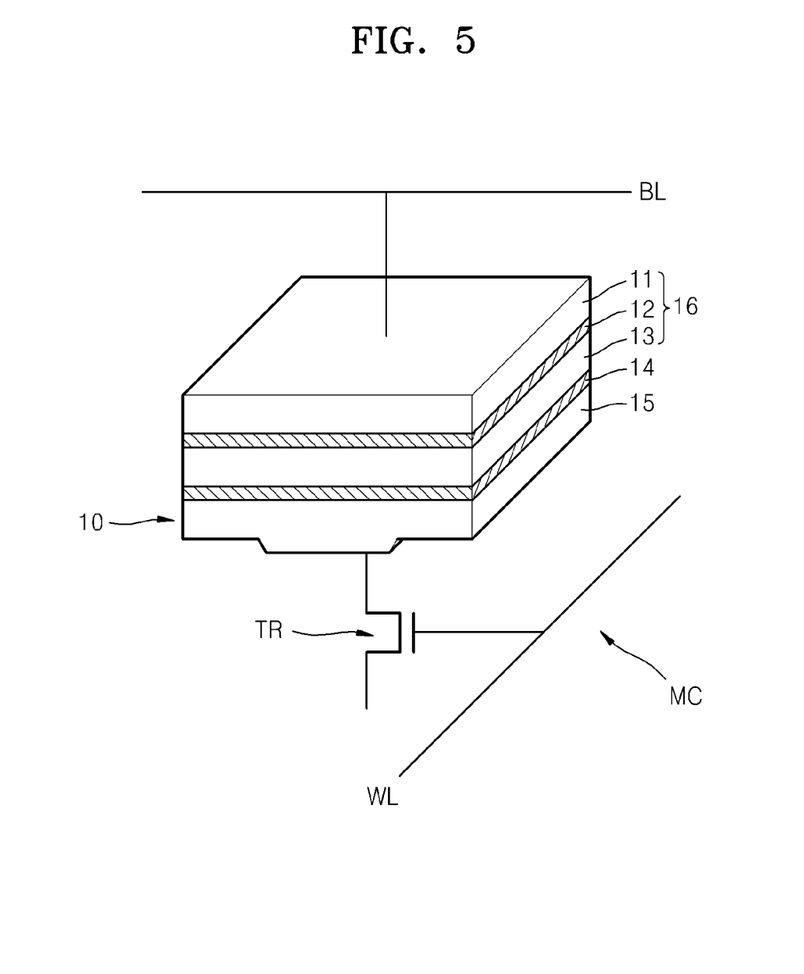
FIG. 5 is a schematic diagram of a memory device including an MTJ cell according to example embodiments.

FIG. 5 is a schematic diagram of a magnetic memory device including the MTJ cell 10 according to example embodiments.

FIG. 5 is a schematic diagram of a memory device including an MTJ cell according to example embodiments.

Referring to FIG. 5, the magnetic memory device may include a memory cell MC, and the memory cell MC may include the MTJ cell 10 of FIG. 1 and a switching device TR connected to the MTJ cell 10. For example, the switching device TR may be a transistor. The memory cell MC may be connected between a bit line BL and a word line WL. The bit line BL and the word line WL may be arranged to cross each other, and the memory cell MC may be arranged at a cross point of the bit line BL and the word line WL. The bit line BL may be electrically connected to the pinned layer 16 of the MTJ cell 10, and the word line WL may be connected to the switching device TR. When the switching device TR is a transistor, a gate electrode of the switching device TR may be connected to the word line WL, and a source/drain electrode of the switching device TR may be electrically connected to the free layer 15 of the MTJ cell 10. In this structure, a write current, a read current, an erase current, etc. may be applied to the memory cell MC via the word line WL and the bit line BL. Although a single memory cell MC is shown in FIG. 5, a plurality of memory cells MC may be arranged in an array form. That is, a plurality of bit lines BL and a plurality of word lines WL may be arranged to cross each other, and each memory cell MC may be arranged at a corresponding cross point.

The magnetic memory device shown in FIG. 5 may be a magnetic random access memory (MRAM). Specifically, as described with reference to FIGS. 3A to 3D, because a magnetization direction of the free layer 15 varies due to a spin torque applied to the free layer 15 in a magnetic memory device, the magnetic memory device may be a spin transfer torque MRAM (STT-MRAM). Unlike an existing MRAM, because the STT-MRAM does not need a separate wiring (i.e., a digit line) for external magnetic field generation, the STT-MRAM is easy to be highly integrated, and an operating method of the STT-MRAM is simple.

Although example embodiments of a thermally stable MTJ cell and a memory device including the same have been described with reference to the attached drawings to help the understanding of the present disclosure, it should be understood that the example embodiments are only illustrative and do not limit the present disclosure. In addition, it should be understood that the present disclosure is not limited to the description shown and described because various other modifications may be achieved by those of ordinary skill in the art.

What is claimed is:

1. A magnetic tunnel junction (MTJ) cell, comprising:
a pinned layer having a pinned magnetization direction;
a separation layer on the pinned layer; and
a free layer on the separation layer and having a variable magnetization direction,
wherein the free layer includes a central part and a marginal part on a periphery of the central part,
the free layer is shaped in the form of a protrusion in which the central part is thicker than the marginal part, and
at least one of the pinned layer and the free layer includes a magnetic material having perpendicular magnetic anisotropy (PMA).

2. The MTJ cell of claim 1, wherein the magnetic material has interface PMA (IPMA).

3. The MTJ cell of claim 1, wherein the pinned layer includes a first pinned layer, a spacer, and a second pinned layer sequentially stacked, and
the first pinned layer and the second pinned layer have pinned magnetization directions opposite to each other.

4. The MTJ cell of claim 3, wherein the first and second pinned layers are formed of the magnetic material, and
the magnetic material has interface PMA (IPMA).

5. The MTJ cell of claim 3, wherein the first pinned layer, the spacer, and the second pinned layer form a synthetic anti-ferromagnetic (SAF) structure.

6. The MTJ cell of claim 1, wherein the central part has a semi-cylindrical shape and the marginal part has a flat shape.

7. The MTJ cell of claim 1, wherein the marginal part is inclined, and the central part gradually rises towards a center of the central part from the inclined marginal part.

8. The MTJ cell of claim 1, wherein the free layer is shaped in the form of a disc, the marginal part of the free layer is shaped in the form of a flat disc, and the central part of the free layer protrudes from the flat disc and is shaped in the form of the disc.

9. The MTJ cell of claim 1, wherein the free layer includes a plurality of domains in which a domain wall is at an interface between adjacent domains, and
an area of the domain wall is widest in the central part.

10. A memory device, comprising:
at least one memory cell, each at least one memory cell including a magnetic tunnel junction (MTJ) cell and a switching device connected to the MTJ cell,
wherein, the MTJ cell includes,
a pinned layer having a pinned magnetization direction,
a separation layer on the pinned layer, and
a free layer on the separation layer and having a variable magnetization direction,
at least one of the pinned layer and the free layer includes a magnetic material having perpendicular magnetic anisotropy (PMA),
the free layer includes a central part and a marginal part on a periphery of the central part, and
the free layer is shaped in the form of a protrusion in which the central part is thicker than the marginal part.

11. The memory device of claim 10, the magnetic material has interface PMA (IPMA).

12. The memory device of claim 10, wherein the pinned layer includes a first pinned layer, a spacer, and a second pinned layer sequentially stacked, and
the first pinned layer and the second pinned layer have pinned magnetization directions opposite to each other.

13. The memory device of claim 12, wherein the first and second pinned layers are formed of the magnetic material, and
the magnetic material has interface PMA (IPMA).

14. The memory device of claim 12, wherein the first pinned layer, the spacer, and the second pinned layer form a synthetic anti-ferromagnetic (SAF) structure.

15. The memory device of claim 10, wherein the central part has a semi-cylindrical shape, and the marginal part has a flat shape.

16. The memory device of claim 10, wherein the marginal part is inclined and the central part gradually rises towards a center of the MTJ cell from the marginal part.

17. The memory device of claim 10, wherein the free layer is shaped in the form of a disc, the marginal part has a flat shape, and the central part protrudes from the marginal part and is shaped in the form of the disc.

18. The memory device of claim 10, wherein the free layer includes a plurality of domains in which a domain wall is at an interface between adjacent domains, and
an area of the domain wall is widest in the central part.

19. The memory device of claim 10, wherein the memory device is a spin transfer torque magnetic random access memory (STT-MRAM).

20. The memory device of claim 10, further comprising:
a bit line and a word line crossing each other,
wherein the bit line is electrically connected to the pinned layer of the MTJ cell, and the word line is electrically connected to the switching device.

* * * * *